United States Patent
Kawahito

(10) Patent No.: US 7,227,490 B2
(45) Date of Patent: Jun. 5, 2007

(54) 2-STAGE A/D CONVERTER AND IMAGE SENSOR USING THE SAME

(75) Inventor: Shoji Kawahito, Hamamatsu (JP)

(73) Assignee: National University Corporation Shizuoka University, Shizuoka (JP)

( * ) Notice: Subject to any disclaimer, the term of this patent is extended or adjusted under 35 U.S.C. 154(b) by 0 days.

(21) Appl. No.: 10/551,230

(22) PCT Filed: Mar. 25, 2004

(86) PCT No.: PCT/JP2004/004169

§ 371 (c)(1),
(2), (4) Date: Sep. 27, 2005

(87) PCT Pub. No.: WO2004/088849

PCT Pub. Date: Oct. 14, 2004

(65) Prior Publication Data

US 2006/0176205 A1    Aug. 10, 2006

(30) Foreign Application Priority Data

Mar. 31, 2003  (JP)  ............................. 2003-093386

(51) Int. Cl.
*H03M 1/12*   (2006.01)
(52) U.S. Cl. ...................................... 341/156; 341/155
(58) Field of Classification Search ................ 341/155, 341/144, 156; 348/308, 241, 300, 301
See application file for complete search history.

(56) References Cited

U.S. PATENT DOCUMENTS

| 7,002,628 B1 * | 2/2006 | Panicacci ..................... 348/307 |
| 7,046,284 B2 * | 5/2006 | Kozlowski et al. ......... 348/308 |
| 7,068,319 B2 * | 6/2006 | Barna et al. ................. 348/372 |

FOREIGN PATENT DOCUMENTS

| JP | 5-152959 | 6/1993 |
| JP | 2002-124877 | 4/2002 |
| JP | 2002124877 A * | 4/2002 |
| JP | 2002-232291 | 8/2002 |
| JP | 2002-261613 | 9/2002 |

\* cited by examiner

*Primary Examiner*—Brian Young
(74) *Attorney, Agent, or Firm*—Westerman, Hattori, Daniels & Adrian, LLP.

(57) ABSTRACT

In a conventional CMOS image sensor, an A/D converter for performing A/D conversion at high-speed arranges the A/D converter elements in columns so as to operate in parallel, and has low resolution in the order of 9 or so bits. The present invention provides an A/D converter for an image sensor, which performs a part of the A/D conversion functions by using a noise cancellation circuit in columns and performs amplification simultaneously with this, thereby obtaining a high signal noise ratio (SNR) and implementing an A/D converter with a high resolution along with the A/D conversion section in a subsequent stage.

16 Claims, 12 Drawing Sheets

Fig.8

| D | φA | φB | φC | φD |
|---|---|---|---|---|
| 0 | 1→1 | 0→0 | 1→1 | 0→0 |
| 1 | 1→0 | 0→1 | 1→1 | 0→0 |
| 2 | 1→1 | 0→0 | 1→0 | 0→1 |
| 3 | 1→0 | 0→1 | 1→0 | 0→1 |

Output of analog residual

2-STAGE A/D CONVERTER AND IMAGE SENSOR USING THE SAME

This application is a 371 of PCT/JP04/04169 filed Mar. 25, 2004.

TECHNICAL FIELD

The present invention relates to the improvement of an A/D converter, and an image sensor using the same.

BACKGROUND ART

One major characteristic of a CMOS image sensor is that various functional circuits can be integrated on the image sensor, and one such functional circuit to be integrated is an A/D converter circuit. By this, a digital output image sensor can be integrated and the system can be compact, and also the influence of noise that enters the output of the sensor chip can be eliminated.

An A/D converter to be integrated on an image sensor is disclosed in the following documents.

[1] A. Simoni, A. Sartori, M. Gottaidi, A. Zorat: "A digital vision sensor", Sensors and Actuators, A46–47, pp. 439–443, 1995
[2] B. Mansoorian, H. Y. Yee, S. Huang, E. Fossum: "A 250 mW 60 frames/s 1280×720 pixel 9b CMOS digital image sensor". Dig. Tech. Papers, Int. Solid-State Circuits Conf., pp. 312–313, 1999
[3] T. Sugiki, S. Ohsawa, H. Miura, M. Sasaki, N. Nakamura, I. Ioune, M. Hoshino, Y. Tomizawa, T. Arakawa: "A 60 mW 10b CMOS imaging sensor with column-to-column FPN reduction", Dig. Tech. Papers, Int. Solid-State Circuits Conf., pp. 108–109, 2000
[4] S. Decker, R. D. McGrath, K. Bremer, C. G. Sodini: "A 256×256 CMOS image array with wide dynamic range pixels and column-parallel digital output", IEEE J. Solid-State Circuits, Vol. 33, No. 12, December 1998
[5] Japanese Patent Application Laid-Open No. 2002-232291

The above-mentioned "A digital vision sensor" discloses a technology for integrating 8-bit integral type A/D converter elements using a lamp signal generator, comparator and register in columns. A similar technology is also disclosed in "DESCRIPTION" of U.S. Pat. No. 2,532,374.

The above-mentioned "A 60 mW 10b CMOS imaging sensor with column-to-column FPN reduction" also discloses a technology for integrating the integral type A/D converter elements in columns, and 10-bit elements are implemented using a comparator of which accuracy has been improved. For these integral type A/D converters, it is difficult to implement a higher resolution since the conversion time is long, and particularly increasing resolution makes the conversion time longer exponentially. However linearity is superb.

The above-mentioned "A 250 mW 60 frames/s 1280×720 pixel 9b CMOS digital image sensor" discloses a technology for arranging successive approximation type A/D converters using a capacitor in columns so as to operate, which is appropriate for image sensors with a high frame rate and many pixels, since high-speed A/D conversion is possible. However the actual precision still remains around 8 bits.

The above-mentioned "A 256×256 CMOS image array with wide dynamic range pixels and column-parallel digital output" discloses a technology for arranging the cyclic A/D converter elements in columns so as to operate, which is also suitable for high-speed A/D conversion. However the resolution is about 9 bits.

The above-mentioned Japanese Patent Application Laid-Open No. 2002-2322915 discloses a technology for performing 2-stage integral type A/D conversion on signals of which noise is cancelled in columns, but this is not for improving the signal noise ratio (SNR) by 2-stage conversion, since the amplification function is not included.

In addition to the above, a few image sensors having A/D conversion elements within the pixel have been reported, but are omitted here since they are not directly related to the present invention.

DISCLOSURE OF THE INVENTION

Conventional A/D converters for an image sensor use only the advantage of arranging the A/D converters in columns so as to operate in parallel.

The present invention provides an A/D converter for an image sensor, which performs a part of the A/D conversion functions by using a noise cancellation circuit in columns, and performs amplification simultaneously with this, thereby obtaining a high signal noise ratio (SNR) and implementing an A/D converter with a high resolution along with the A/D conversion sections in a subsequent stage, and each can implement a digital image sensor with high sensitivity and wide dynamic range.

It is an object of the present invention to perform A/D conversion with maintaining high resolution and high SNR in an image sensor by performing N-bit A/D conversion along with noise cancellation operation in columns, and performing M-bit A/D conversion in columns or after performing horizontal scanning on residual analog values.

It is another object of the present invention to simplify circuits by having an amplifier that cancels noise perform a part of the A/D conversion.

The present invention is applied to an image sensor, for example, but is not limited to this application.

BRIEF DESCRIPTION OF THE DRAWINGS

FIG. 8 is a table showing the change of φA, φB, φC and φD with respect to the value D in 2-bit A/D conversion;

BEST MODE FOR CARRYING OUT THE INVENTION

Figure 1:
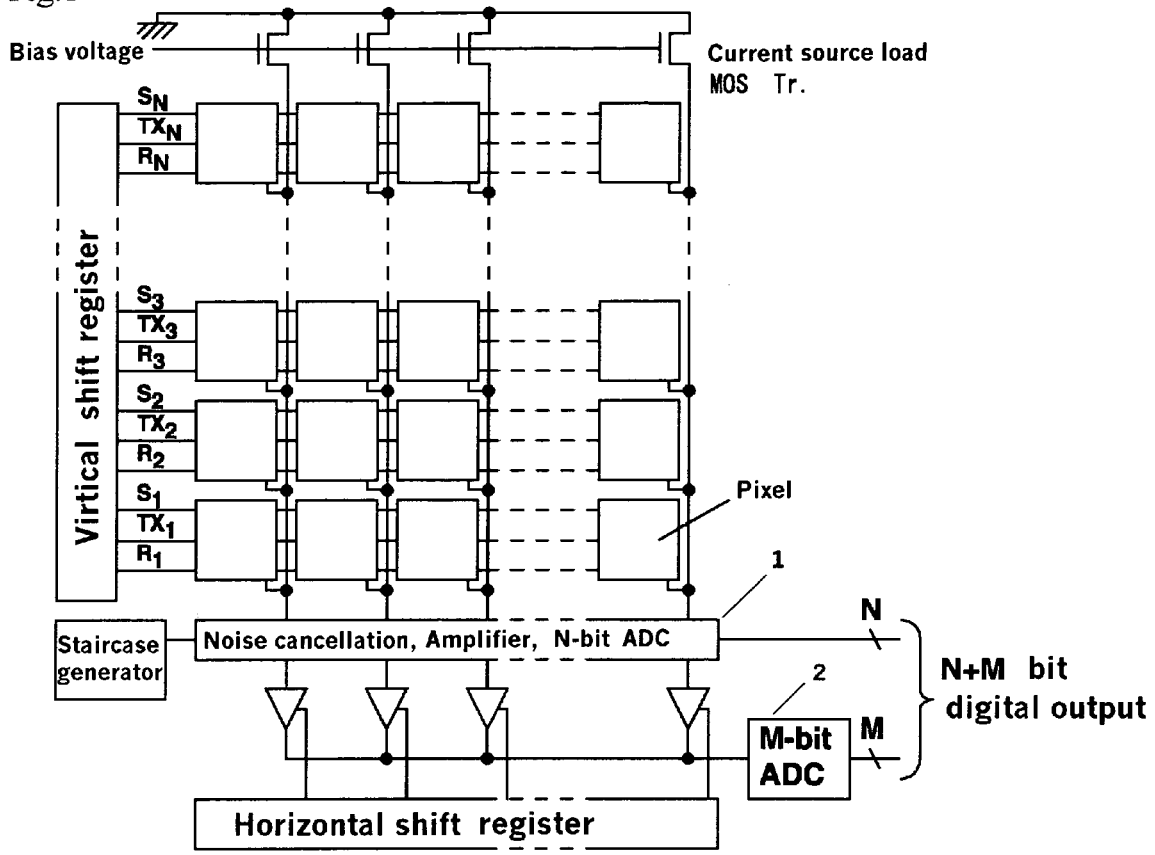
FIG. 1 is a block diagram depicting a 2-stage A/D converter for performing A/D conversion on the analog residual after horizontally scanning.

FIG. 1 is a block diagram depicting the first embodiment. The element circuits (1), which perform signal amplification and N-bit A/D conversion arranged in an array in the columns of the image sensor, are operated in parallel. The analog residual thereof is horizontally scanned, and M-bit A/D conversion (2) is performed on the output thereof, so as to perform N+M-bit A/D conversion.

Figure 6:
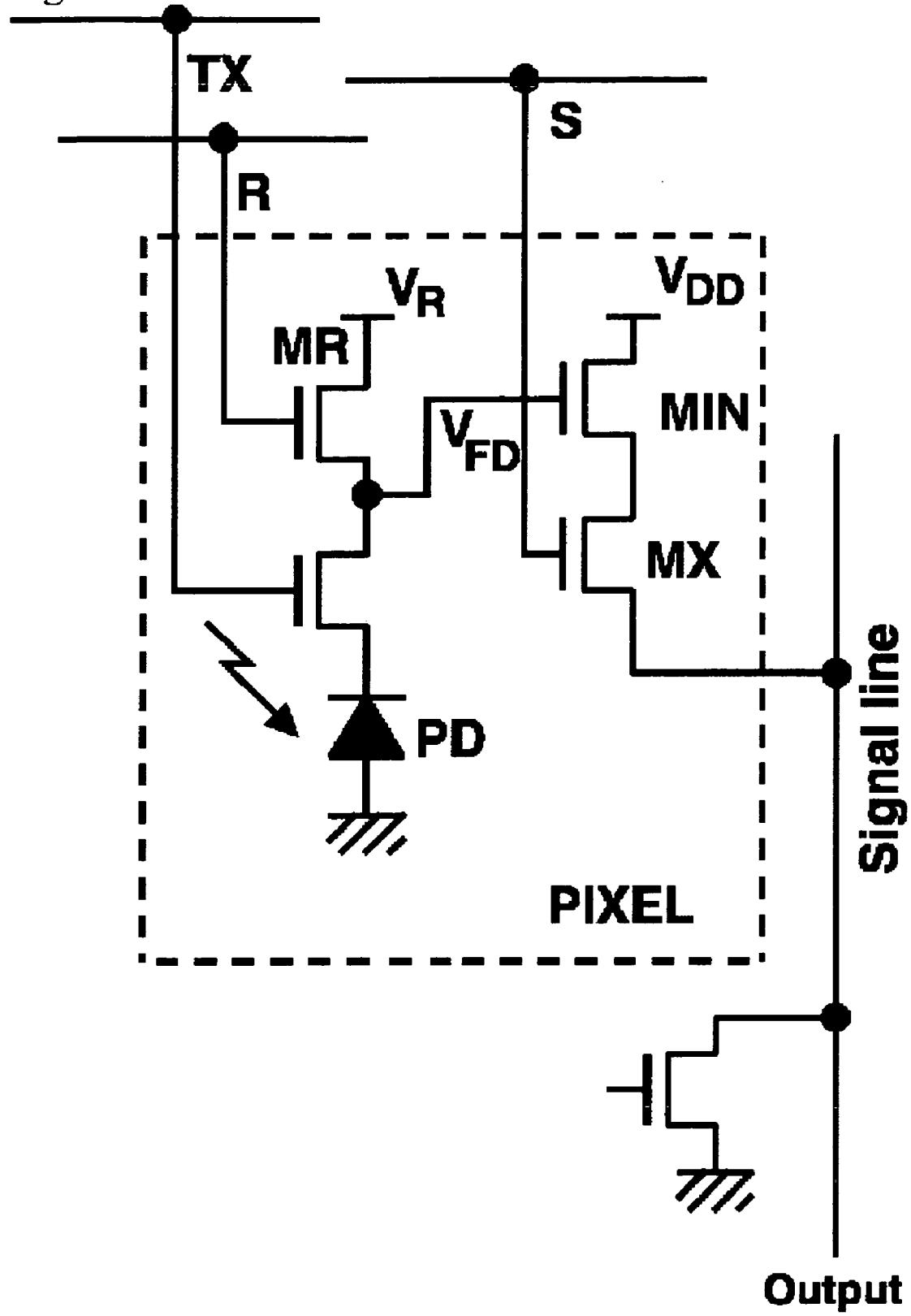
FIG. 6 is a diagram depicting a 4-transistor pixel circuit.

The control lines S, TX and R, from the vertical shift register, correspond to each control line in FIG. 6.

Figure 2:
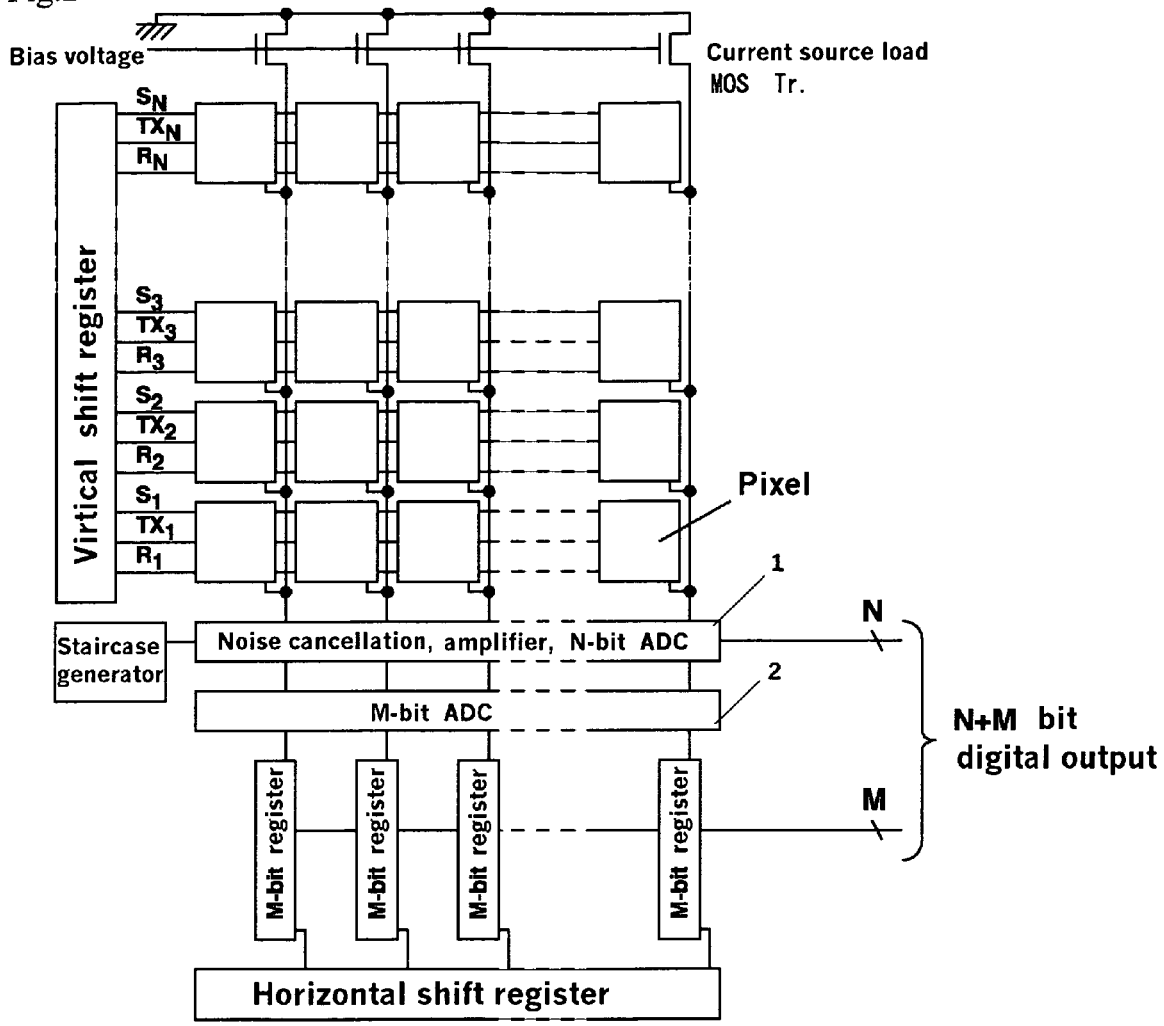
FIG. 2 is a block diagram depicting a 2-stage A/D converter for performing A/D conversion on the analog residual in columns.

FIG. 2 is a block diagram depicting the second embodiment. Here the element circuits (1), for performing noise cancellation, signal amplification and N-bit A/D conversion arranged in an array in the columns of the image sensor, perform A/D conversion in parallel, and M-bit A/D conversion elements, arranged in an array, are operated on the analog residual output.

Figure 3:
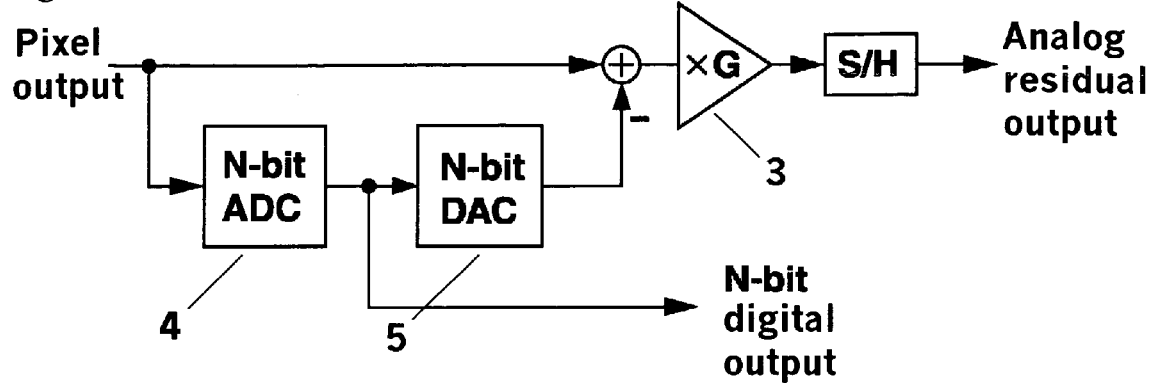
FIG. 3 is a diagram depicting a unit circuit for performing column amplification and N-bit A/D conversion (A/D conversion first)
Figure 4:
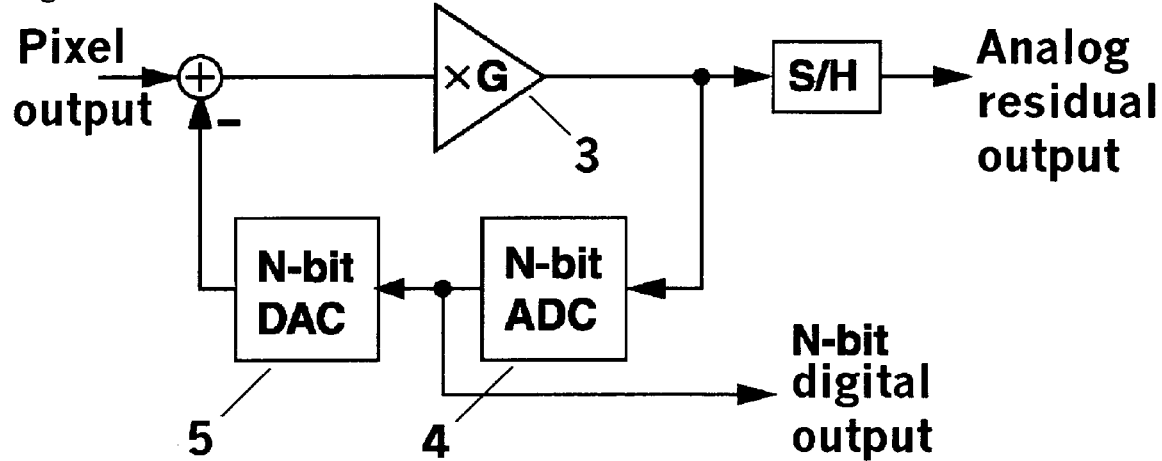
FIG. 4 is a diagram depicting a unit circuit for performing column amplification and N-bit A/D conversion (pull-back method)

FIG. 3 and FIG. 4 show the configuration of the unit circuits (1) which perform noise cancellation, amplification and N-bit A/D conversion in columns. In any case, in the columns of the image sensor, N-bit A/D conversion is performed while performing amplification with G times gain, and a predetermined value is subtracted according to the result, so that a saturation of the output of the amplifier is prevented. In FIG. 3, N-bit A/D conversion is performed first on the pixel output, and the predetermined value is subtracted from the pixel output signal so that the output of the amplifier enters a linear operation range.

In the case of FIG. 4, G times of amplification is performed first on the pixel output, A/D conversion is performed on this amplified output, D/A conversion is performed on this result, a predetermined value is subtracted from the input of the amplifier, and this process is repeated until the output of the amplifier enters a linear range. This is called the "pull-back method".

Various configuration to perform an equivalent operation as above are possible, and the configuration of the present invention is not limited strictly to this block diagram. In FIG. 3 and FIG. 4, a function to cancel the noise generated in the pixel section is not clearly shown, but the noise cancellation function can be integrated into the amplification function by the G times amplifier. An actual example of this will be described later.

Figure 5:
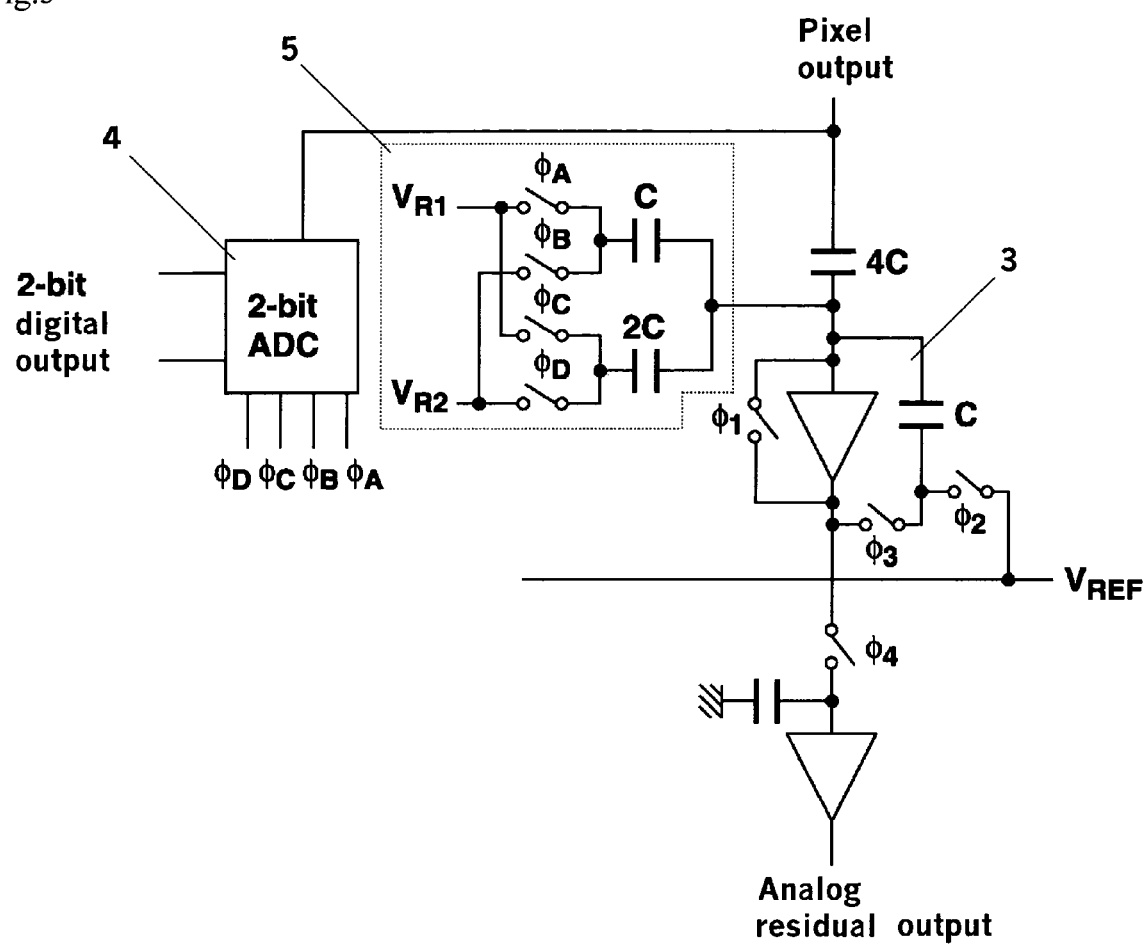
FIG. 5 is a diagram depicting a circuit example of 4 times amplification and 2-bit A/D conversion.

FIG. 5 shows a circuit diagram in the case of 2-bit A/D conversion, which corresponds to the configuration in FIG. 3. FIG. 6 shows the configuration example of the pixel section. This is a pixel circuit of 4 transistors +1 photodiode, using a buried photo-diode. Another circuit, such as a 3-transistor pixel circuit, may be used instead.

The photoelectric charges converted by the buried photo-diode (PD) are fetched by transistors (MIN, MX), and are output to the output ends of the pixel group via a signal line.

This signal is applied to the A/D converter (2-bit ADC) as the pixel output, and is connected to the input of the amplifier (3) having gain G via the capacitor 4C (having 4 times the capacitance compared with capacitor C). From the A/D converter (4), the control signals for switching φA, φB, φC and φD, corresponding to the level of the input signal, are output.

The A/D conversion value by the A/D converter is D/A converted by the switch which is controlled by the control signals φA, φB, φC and φD, and the D/A converter (5) based on the capacitors C and 2C (note: 2C has double the capacity of C), and this result is subtracted from the input. In other words, the output Y with respect to the input X is determined as follows

[Expression a1]

$$Y = G \times X - R \times D \quad (a1)$$

Here R is a full scale (FS) value of the input. For G, G=4 is normally used in the case of 2 bits, but a greater value may be used to provide a larger amplification function.

D is a result of the A/D conversion at 2 bits, and is determined as follows.

[Expression a2]

$$D = \begin{cases} 0 & (X \leq FS/4) \\ 1 & (FS/4 < X \leq FS/2) \\ 2 & (FS/2 < X \leq 3FS/4) \\ 3 & (3FS/4 < X \leq FS) \end{cases} \quad (a2)$$

This D is output as the higher 2-bit A/D conversion value. Y, on the other hand, is an analog residual output value.

Figure 7:
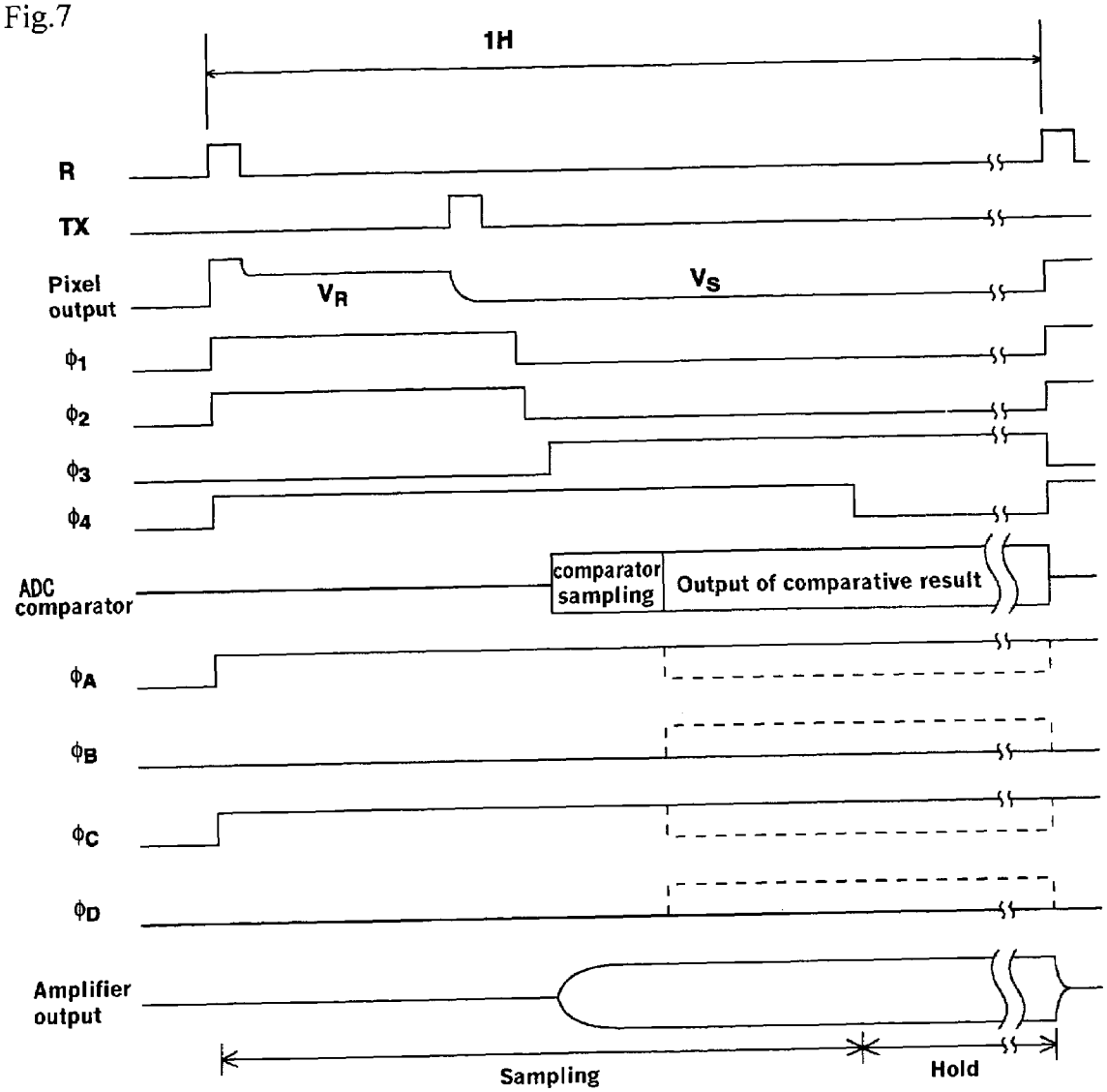
FIG. 7 is a timing chart depicting a 2-bit column A/D conversion operation.

FIG. 7 shows a timing chart when the above operation is performed by combining the pixel circuits in FIG. 5 and FIG. 6. From the pixel output (sensor output), the reset level $V_R$ and the signal level $V_s$ are output, as shown in FIG. 7.

φ1, φ2, φ3 and φ4 are the control signals for switching the switch circuit near the amplifier.

First the input and the output of the amplifier are shorted with φ1=1, and the level of $V_R$ is sampled into the capacitor 4C. At this time φ2=1. Then by setting φ1=0, φ2=0 and φ3=1, the level of $V_s$ is provided to 4C. As a result, a signal when $V_R - V_S$ is amplified 4 times appears in the output of the amplifier. Also $X = V_R - V_s$ is provided to the 2-bit A/D converter, and φA φB, φC and φD change according to the result. As a consequence, the output voltage (analog residual output) is determined according to Expressions (a1) and (a2) as $R = V_{R2} - V_{R1}$. When the comparator in the 2-bit A/D converter is sampling, φA=φC=1 and φB=φD=0. At the timing when this comparison result is output, φA, φB, φC and φD are changed, as shown in FIG. 8.

Figure 9:
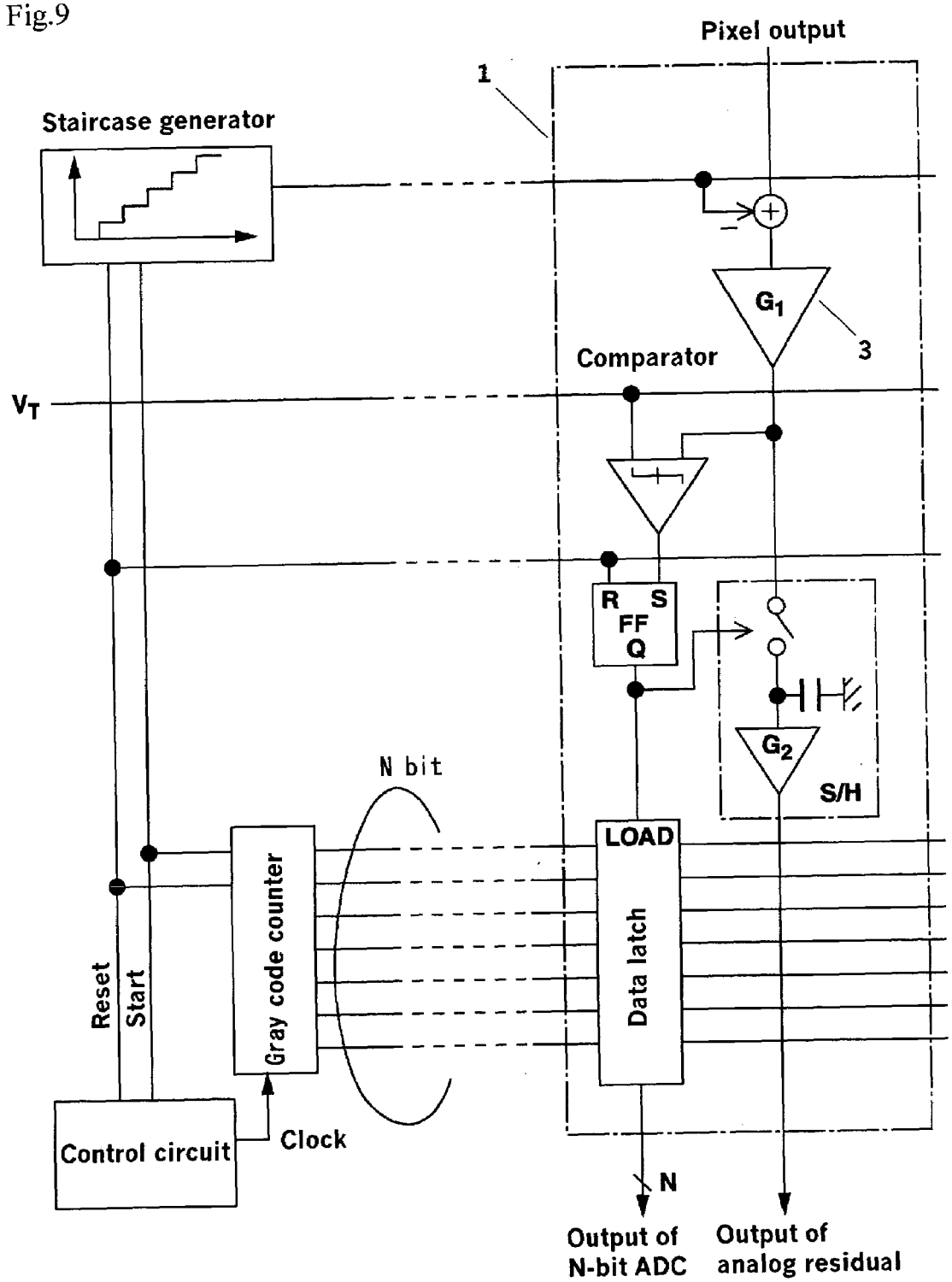
FIG. 9 is a diagram depicting a column read circuit for performing pull-back type N-bit A/D conversion and generating analog residuals.
Figure 10:
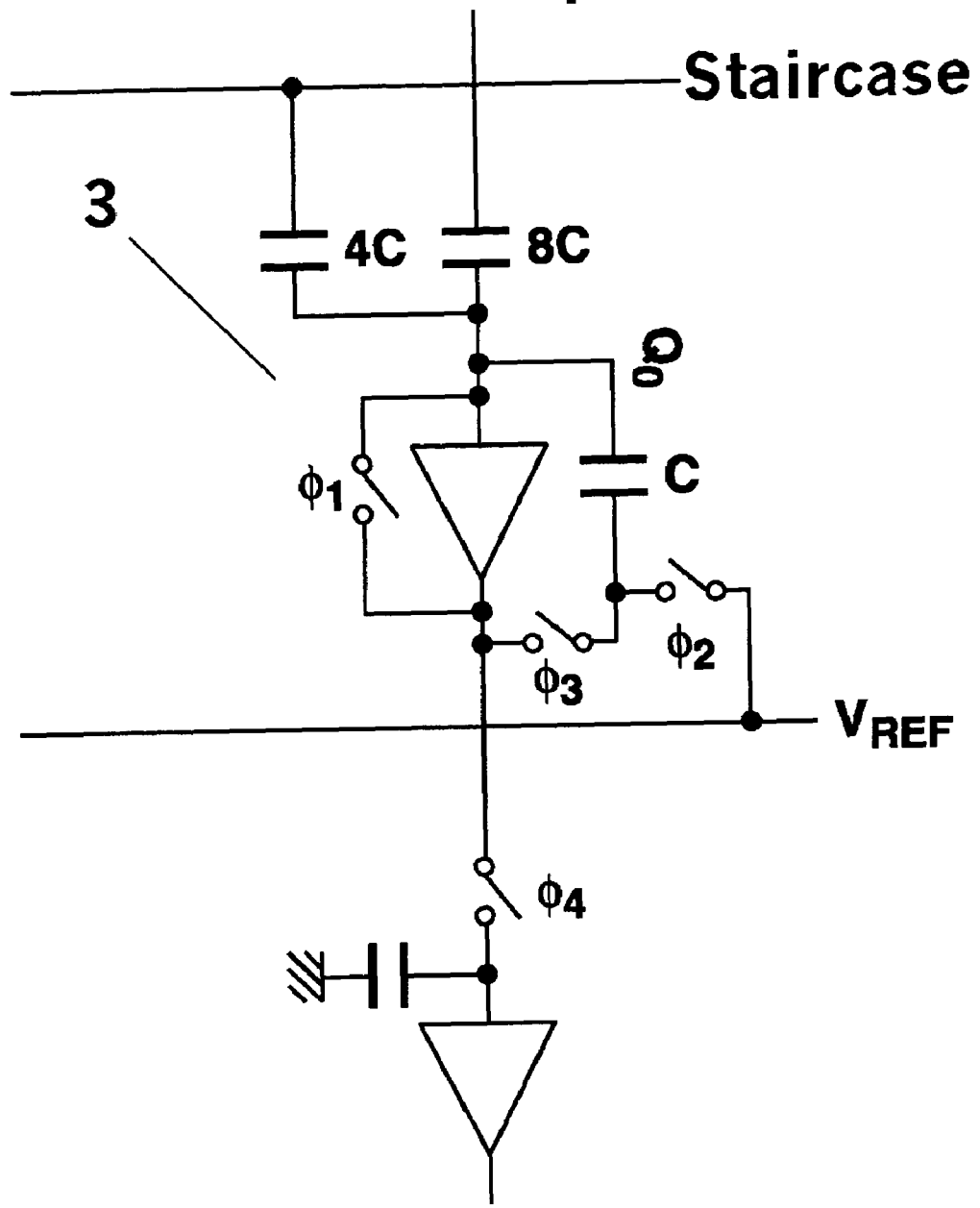
FIG. 10 is a diagram depicting an example of a circuit which performs noise cancellation and pull-back while performing 8 times amplification.
Figure 11:
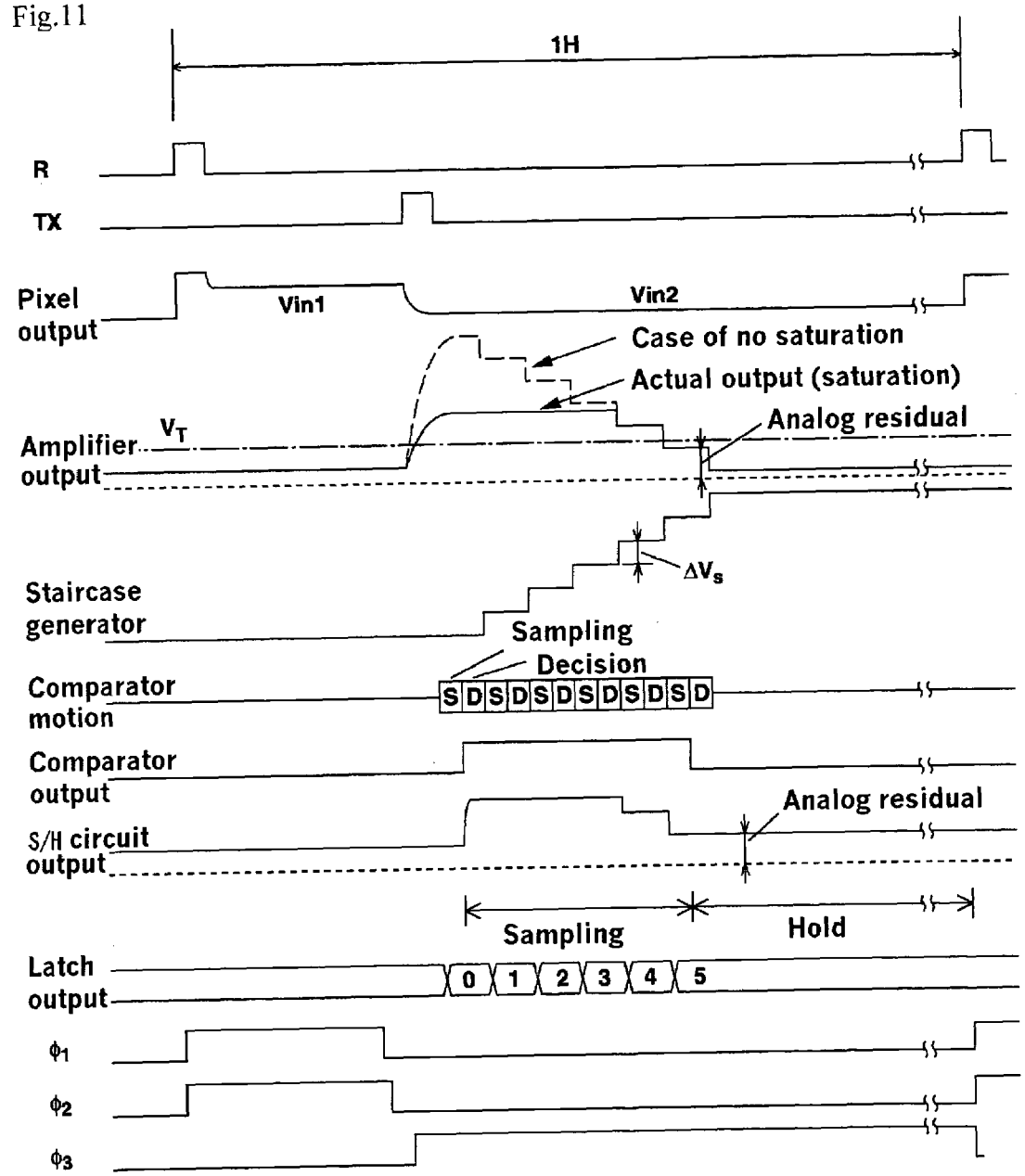
FIG. 11 is a diagram depicting the operation of the pull-back A/D conversion.

FIG. 9 shows a circuit for performing pull-back A/D conversion in the columns and calculating the analog residual, and FIG. 10 shows a concrete circuit example of the input section thereof. FIG. 11 shows the operation timing chart thereof. The pixel circuit is assumed to be a 4-transistor type which transfers charges within the pixel, as shown in FIG. 6. Other pixel circuits, such as a 3-transistor pixel circuit, can be used in the same manner by changing the timing. First the reset level $V_R$ is output, then the signal level $V_s$ is output.

FIG. 11 shows the case of 8 times amplification. First the input and the output of the amplifier is shorted with φ1=1, φ2=1 and φ3=0, and one end of the feedback capacitor is connected to Vref, and the $V_R$ level is sampled into the capacitor 8C having 8 times the capacitance compared with the capacitor C. Then after setting to $\phi 1=0$, $\phi 2=0$ and $\phi 3=1$, the signal level $V_s$ is supplied to 8C. As a result, a signal of $V_R-V_s$, amplified to 8 times, appears in the output of the amplifier. If $V_R-V_s$ is large, however, the applied signal exceeds the linear range of the amplifier, and is saturated. However if the charge $Q_0$ in the input section of the amplifier is not changed at this time, the output of the amplifier can be pulled back into a linear range by using the capacitor in the input section.

When $V_R$ is being sampled, the charge $Q_0$ in the input section of the amplifier is given by the following expression.

[Expression 1]

$$Q_0 = 8C(V_0^* - V_R) + C(V_0^* V_{REF}) + 4C(V_0^* = V_{SW0}) + C_i V_0^* \quad (1)$$

Here $V_0^*$ is the voltage of the amplifier input section when $V_R$ is being supplied, and C1 is the parasitic capacitance between the amplifier input unit and the ground point. $V_{SW0}$ is the initial voltage of the stair case waveform.

After the input is switched to $V_s$ and the feedback capacitance C is connected to the amplifier output, the following expression is established if $Q_0$ is not changed.

[Expression 2]

$$Q_0 = 8C(V_0 - V_S) + C(V_0 - V_{OUT}) + 4C(V_0 - V_{SW}) + C_i V_0 \quad (2)$$

Here $V_{SW}$ is the voltage of the staircase waveforms. And $V_0$ is the voltage of the amplifier input section when $V_s$ is being sampled. If $V_R-V_s$ is large at this time, the amplifier is saturated, and $V_0$ largely changes from $V_0^*$. However if $V_{SW}$ is operated and pulled back to the area where the amplifier operates at high gain, then the following expression is established.

[Expression 3]

$$V_{OUT} = A(V_0^* - V_0) + V_0^* \quad (3)$$

Here A is an open loop gain of the amplifier. If A is sufficiently large, $V_0^* - V_0$ must be roughly zero to receive voltage with which $V_{out}$ operates in a linear area, since this circuit is operating as a negative feedback circuit. This can be understood easily if it is considered in the same manner as the case when a negative feedback circuit is constructed using an operation amplifier of which the open loop gain is large, where the differential voltage of the plus input and the minus input for operation is roughly zero.

Now if (1) and (2) are regarded as simultaneous equations where $V_0^* - V_0 = 0$, then the following expression can be acquired.

[Expression 4]

$$V_{OUT} = V_{REF} + 8(V_R - V_S) - 4(V_{SW} - V_{SW0}) \quad (4)$$

This means that the output voltage becomes a voltage when $V_R-V_s$ amplified 8 times is added to $V_{REF}$, then 4 times the differential voltage of $V_{SW}-V_{SW0}$ is subtracted from the result. In other words, by operating the amplifier so that $Q_0$ does not change and pulling back the amplifier to the point where the amplifier operates at high gain, the linear operation determined by Expression (4) can be performed.

With this approach, a circuit which performs A/D conversion using a staircase waveform generator and a comparator and which generates a residual analog value can be constructed as shown in FIG. 9. As the timing chart in FIG. 11 shows, the output of the staircase waveform generator remains as $V_{SW0}$ initially, and when amplification is performed, the output of the amplifier is saturated, and is clipped. Then if the staircase waveform is supplied, the output of the amplifier enters an area where the amplifier operates at high gain at a certain point, and Expression (4) is satisfied, then the output of the amplifier decreases according to the level of the staircase waveform. So if the comparator performs comparison operation (sampling (S) and decision (D)) for the output of the amplifier and the threshold value $V_T$ each time a step of the staircase waveform rises, the output of the comparator changes from High to Low at a point when the output of the amplifier becomes $V_T$ or less. By this, the sample and hold circuit (S/H) connected to the output of the amplifier samples and stores the signal at this point. This becomes the analog residual. The number of steps when the output of the amplifier becomes $V_T$ or less at this time becomes the A/D conversion value. There are 5 steps in the case of FIG. 11.

If one step of the staircase waveform is $\Delta V_S$, Expression (4) can be written as follows, where the number of steps is D.

[Expression 5]

$$V_{OUT} - V_{REF} = 8(V_R - V_S) - 4D\Delta V_S \quad (5)$$

Figure 12:
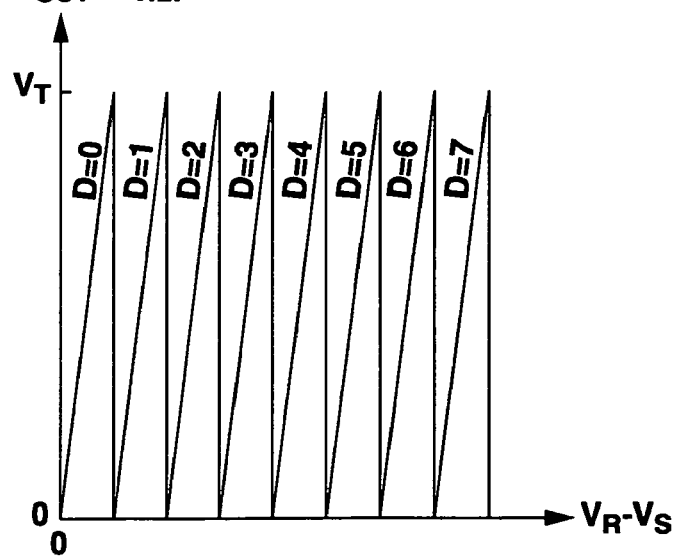
FIG. 12 is a diagram depicting the relationship between the input and output of an amplifier.

FIG. 12 is a diagram depicting this relationship when $V_T = 4\Delta V_S$. In order to store the value D, which corresponds to the A/D conversion value, a code corresponding to the number of steps of the staircase waveform (e.g. graycode, binary code is also acceptable) is supplied to the data latch, and the code is stored in the data latch by the output of the comparator. In FIG. 12, when 3-bit A/D conversion is possible and the input of the analog residual of the amplifier output is in a 0 to $V_T$ range, the output thereof also comes in a 0 to $V_T$ range.

There are many advantages to performing this processing in the initial stage on the columns of the image sensor. First as Expression (5) shows, the difference of the reset level and the signal level of the pixel section is amplified while performing the above function, fixed pattern noise generated and reset noise in the pixel section can be cancelled, and the 1/f noise generated in the pixel section can also be decreased.

Also amplification can be performed at high gain while preventing the saturation of the output of the amplifier. This can dramatically decrease the influence of noise which is applied on the circuit thereafter, and an image sensor with low noise level can be implemented. Also by partially performing A/D conversion by this circuit, the A/D conversion circuit, to be connected in a subsequent stage, can be simplified, and the burden on this A/D conversion circuit can be decreased.

Finally, this processing is particularly advantageous when an integral type A/D conversion is used in a subsequent stage of the above mentioned circuit. An integral type A/D converter is widely used as a high precision A/D conversion system since it is superb in linearity, but the problem thereof is that the conversion time is long. An integral type A/D converter supplies the lamp signal and the input signal to the comparator, and the count of the clock until the lamp signal exceeds the input signal, counted by the counter, is used as the A/D conversion value, and if 10-bit A/D conversion is performed by an integral type, counting up to 1024 is normally required. A technology to perform 10-bit A/D conversion using an integral type on the image sensor has been reported, but it is difficult to apply this to a high-speed image sensor.

If 3-bit A/D conversion is performed in advance and integral type A/D conversion is performed on the analog residual, as in the present invention, then the count can be 1/8, that is 128, and the integral type can be used for a high-speed image sensor. In the case when A/D conversion is performed with very high resolution, and 10-bit and 1024 counts can be implemented as the integral type A/D conversion, 3-bit A/D conversion is performed beforehand, then an A/D conversion equivalent to 13 bits can be performed, and an image sensor with high resolution digital output can be implemented.

The analog residual in FIG. 12 is ideally in a 0V to $V_T$ range, but if an error occurs to the decision of the comparator, the analog residual exceeds this range. So the analog input range of the A/D conversion in a subsequent stage on the analog residual is set to wider than this range. Then even if a minor error occurs to the comparator, this does not influence the final A/D converted digital value, and the accuracy requirements of the comparator can be relaxed.

FIG. 12 is the case of 3 bits and 8 times amplification, and the voltage range of the analog residual output can be increased by choosing the gain to be $2^N$ when N-bit A/D conversion is performed. If the resolution of the A/D conversion is high however, gain becomes very high and implementation may become difficult. In this case, the gain may be set to lower than $2^N$. In such a case, the analog residual output becomes small, but the gain of the S/H circuit may be set to a value higher than 1, as shown in FIG. 9 ($G_2$ in the case of FIG. 9), for amplification.

Figure 13:
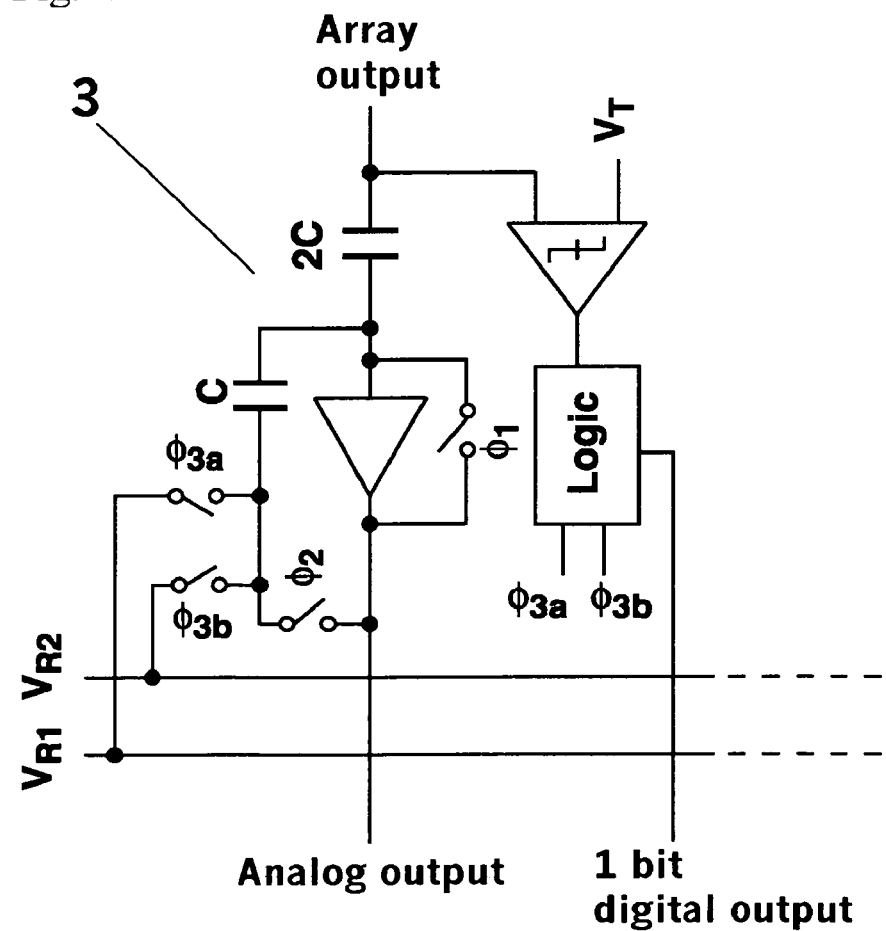
FIG. 13 is a diagram depicting a circuit for performing noise cancellation, 2 times amplification and 1-bit A/D conversion.

FIG. 13 shows the third embodiment. This is a configuration when 1-bit A/D conversion is performed while performing noise cancellation and two times amplification in columns. This circuit can be applied to a pixel circuit where the signal level is output first, and the reset level is output later.

When the amplifier output is $V_{OUT}$, the signal level of the output of the pixel section is $V_s$, the reset level is $V_R$, and the differential voltage thereof is $\Delta V_{in}=V_R-V_s$, the following expression is established.

[Expression 6]

$$V_{OUT}=-2\Delta V_{in}+V_{R1}-D(V_{R1}-V_{R2}) \quad (6)$$

Here D is an A/D conversion value, and is defined as follows.

[Expression 7]

$$D = \begin{cases} 0 & (V_S > V_T) \\ 1 & (V_S \leq V_T) \end{cases} \quad (7)$$

Figure 14:
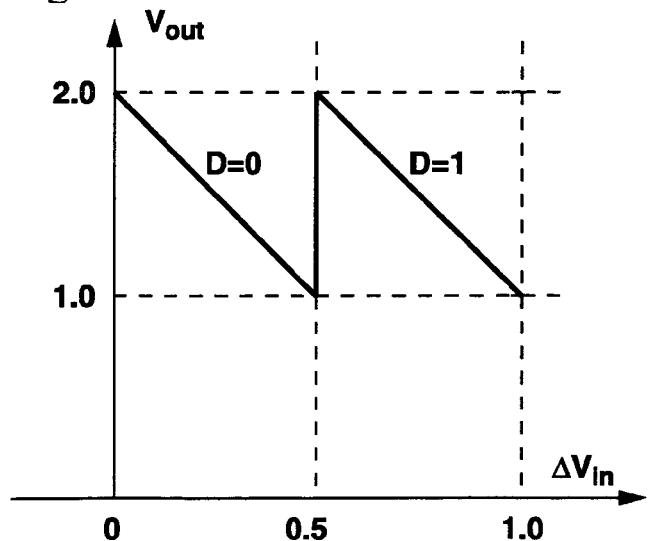
FIG. 14 is a diagram depicting the transmission characteristics of the circuit in FIG. 13.

In other words, this circuit changes the reference bias voltage of the amplifier output depending on the result of A/D conversion. An example is given. When the signal level $V_s$ changes in a 2V to 1V range and $V_R$ is 2V, it is assumed that VT=1.5V. At this time, $\Delta V_{in}$ changes in a 0–1V range. If $V_{R1}$=2V, $V_{R2}$=3V in Expression (6) at this time, then $V_{OUT}$ changes as shown in FIG. 14 with respect to $\Delta V_{in}$.

While the change range of the input signal is 1V, the output can also be confined in a 1V range from 2V to 1V. The gain of the output, with respect to the input signal, is 2 times. In this way the amplification range of the output can be confined to 1V, even if the input signal level is doubled to increase sensitivity.

Figure 15:
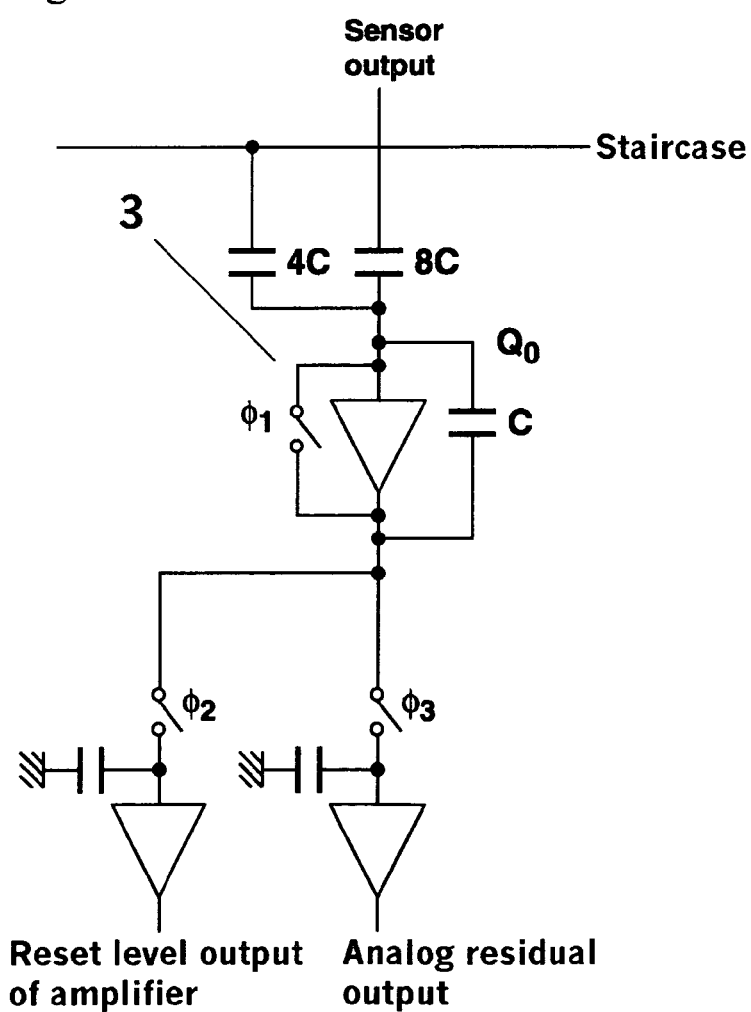
FIG. 15 is a diagram depicting a variant form of the circuit in FIG. 9, which outputs the amplifier reset level and the analog residual output separately.

FIG. 15 shows a circuit where a sample & hold circuit, for storing the reset level of the amplifier, is installed to remove the offset voltage of the column amplifier. The pixel circuit used here is a 4-transistor type, which transfers charges within the pixel, as shown in FIG. 6. Other pixel circuits, such as a 3-transistor pixel circuit, can be used in the same manner by changing the timing. It is assumed that the reset level $V_R$ is output first, then the signal level $V_s$ is output.

First the input and the output of the amplifier are shorted with φ1=1 and φ2=1, and the $V_R$ level is sampled into 8C. Then the output of the amplifier is stored in one sample & hold circuit with φ1=0 and φ20. Then TX in the pixel is opened so as to supply the signal level $V_s$ to 8C. As a result, a signal of $V_R-V_s$ amplified to 8 times appears in the output of the amplifier. In this case, when $V_R$ is being sampled, the charge $Q_0$ in the input section of the amplifier is given by the following expression.

[Expression b1]

$$Q_0=8C(V_0^*-V_R)+4C(V_0^*-V_{SW0})+C_iV_0^* \quad (b1)$$

If $Q_0$ does not change after the input is switched to $V_s$ and the feedback capacitance C is connected to the amplifier output, the following expression is established.

[Expression b2]

$$Q_0=8C(V_0-V_S)+C(V_0-V_{OUT})+4C(V_0-V_{SW})+C_iV_0 \quad (b2)$$

Here $V_{SW}$ is the voltage of the staircase waveform. If $V_R-V_s$ is large at this time, the amplifier saturates and $V_0$ dramatically changes from $V_0^*$. However if $V_{SW}$ is operated and the amplifier is pulled back to the area where the amplifier operates at high gain, then $V_0^*-V_0$ approaches zero by negative feedback.

Now if (b1) and (b2) are regarded as simultaneous equations where $V_0^*-V_0=0$, then the following expression can be acquired.

[Expression b3]

$$V_{OUT}=V_0^*+8(V_R-V_S)-4(V_{SW}-V_{SW0}) \quad (b3)$$

This means that the output voltage becomes a voltage when $V_R-V_s$ amplified 8 times is added to $V_0^*$, then 4 times the differential voltage of $V_{SW}-V_{SW0}$ is subtracted from the result. If the output $V_0^*$ when the amplifier is shorted is sampled and held, and the difference from the output of another sample & hold circuit storing the result of Expression (b3) is determined, and the offset voltage of the amplifier is cancelled.

With the exception of this point, the rest of the operation is the same as FIG. 9. φ3 in FIG. 15 is controlled by the output of the comparator, just like the case of the sample & hold circuit in FIG. 9.

INDUSTRIAL APPLICABILITY

According to the configuration described above, the analog residual, after the first A/D conversion with N bits, is amplified, and the second A/D conversion with M bits is performed on this result, therefore M-bit A/D conversion can be performed with high resolution, about 10 bits, so if the N-bit A/D conversion in the first stage is 3 bits or 4 bits, then an A/D conversion with extremely high resolution, such as 13 bits -14 bits, is possible, and a digital output image sensor with a wide dynamic range can be implemented.

Also as an A/D converter for an image sensor, if a part of the A/D conversion functions is performed by a noise cancellation circuit in columns and amplification is performed simultaneously, then A/D conversion with high resolution can be implemented along with the A/D conversion section in a subsequent stage, while increasing the high signal noise ratio (SNR).

The invention claimed is:

1. A 2-stage A/D converter, comprising:
an element circuit comprising N-bit A/D conversion means arranged in an array and an amplifier for amplifying an analog residual which is a difference between an input signal and an N-bit A/D conversion result; and
M-bit A/D conversion means for performing A/D conversion on said analog residual,
wherein an A/D conversion in a first stage is performed on the input signal by the N-bit A/D conversion means, and an A/D conversion in a second stage is performed on the amplified analog residual by the M-bit A/D conversion means, so as to perform N+M bit A/D conversion, and
wherein a predetermined value is subtracted from the input signal such that the output of the amplifier is controlled in a linear area without being saturated.

2. The 2-stage A/D converter according to claim 1, wherein said amplifier performs G times amplification using a capacitance ratio of a capacitor, and the A/D conversion result is converted into an analog signal by switching a connection potential of one end of the capacitor of which the other end is connected to the input of said amplifier, and the output of said amplifier is controlled within a linear area without being saturated by subtracting said analog signal from the input signal, even if G times amplification is performed.

3. The 2-stage A/D converter according to claim 1, wherein said amplifier is for performing G times amplification using a capacitance ratio of a capacitor, and in said N-bit A/D conversion, once a G times amplification operation is performed on a pixel signal, and the predetermined value is subtracted from the input signal using another capacitor when an output of said amplifier exceeds a reference voltage while the output of said amplifier and said reference voltage are sequentially compared by a comparator, so that the output of said amplifier is pulled back to a linear area even if the output of said amplifier is saturated, and the number of stages used to pull back the output of said amplifier to a predetermined voltage is regarded as the N-bit digital value, and the output of said amplifier after pull back is output as the analog residual.

4. An image sensor, comprising:
an element circuit comprising N-bit A/D conversion means arranged in an array, and an amplifier for amplifying an analog residual which is a difference between a pixel output and an N-bit A/D conversion result; and
M-bit A/D conversion means for performing A/D conversion on said analog residual,
wherein an A/D conversion in a first stage is performed on the pixel output in columns of the image sensor by the N-bit A/D conversion means, and an A/D conversion in a second stage is performed on the amplified analog residual by the M-bit A/D conversion means, so as to perform N+M bit A/D conversion, and
wherein a predetermined value is subtracted from the input signal such that the output of the amplifier is controlled in a linear area without being saturated.

5. The image sensor according to claim 4, wherein said M-bit A/D conversion means for the analog residual performs the M-bit A/D conversion after horizontally scanning the analog values.

6. The image sensor according to claim 4, wherein said M-bit A/D conversion means for the analog residual operates M bits of A/D conversion elements arranged in an array in columns.

7. The image sensor according to claim 4, wherein said N-bit A/D conversion means comprises one comparator, a lamp signal generator common for columns, and a register for fetching a graycode value, which is supplied from outside a column, at the point when the output of the comparator changes.

8. The image sensor according to claim 4, wherein said N-bit A/D conversion means for the pixel output performs A/D conversion using a 1-bit comparator, said amplifier performs G times amplification in columns using the capacitance ratio of the capacitor, and by connecting one end of the capacitor to an input of said amplifier, and the other end of the capacitor to a reference voltage at reset, and changing said reference voltage to determine the operation point of the output voltage of the amplifier by the output of said 1-bit comparator, the output of said amplifier is controlled within a linear area without being saturated, even if G times amplification is performed.

9. The image sensor according to claim 4, wherein said amplifier has a function to acquire the difference between the pixel output of the reset level and the pixel output of the signal level, and performs noise cancellation by the function.

10. A 2-stage A/D converter, comprising:
an element circuit comprising N-bit A/D conversion means arranged in an array and an amplifier for amplifying an analog residual which is a difference between an input signal and an N-bit A/D conversion result; and
M-bit A/D conversion means for performing A/D conversion on said analog residual,
wherein an A/D conversion in a first stage is performed on the input signal by the N-bit A/D conversion means, and an A/D conversion in a second stage is performed on the amplified analog residual by the M-bit A/D conversion means, so as to perform N+M bit A/D conversion, and
wherein said amplifier performs G times amplification using a capacitance ratio of a capacitor, and the A/D conversion result is converted into an analog signal by switching a connection potential of one end of the capacitor of which the other end is connected to the input of said amplifier, and the output of said amplifier is controlled within a linear area without being saturated by subtracting said analog signal from the input signal, even if G times amplification is performed.

11. A 2-stage A/D converter, comprising:
an element circuit comprising N-bit A/D conversion means arranged in an array and an amplifier for amplifying an analog residual which is a difference between an input signal and an N-bit A/D conversion result; and
M-bit A/D conversion means for performing A/D conversion on said analog residual,
wherein an A/D conversion in a first stage is performed on the input signal by the N-bit A/D conversion means, and an A/D conversion in a second stage is performed on the amplified analog residual by the M-bit A/D conversion means, so as to perform N+M bit A/D conversion, and
wherein said amplifier is for performing G times amplification using a capacitance ratio of a capacitor, and in said N-bit A/D conversion, once a G times amplification operation is performed on a pixel signal, and the predetermined value is subtracted from the input signal using another capacitor when an output of said amplifier exceeds a reference voltage while the output of said amplifier and said reference voltage are sequentially compared by a comparator, so that the output of said amplifier is pulled back to a linear area even if the output of said amplifier is saturated, and the number of stages used to pull back the output of said amplifier to a predetermined voltage is regarded as the N-bit digital value, and the output of said amplifier after pull back is output as the analog residual.

12. An image sensor, comprising:
an element circuit comprising N-bit A/D conversion means arranged in an array, and an amplifier for amplifying an analog residual which is a difference between a pixel output and an N-bit A/D conversion result; and
M-bit A/D conversion means for performing A/D conversion on said analog residual,
wherein an A/D conversion in a first stage is performed on the pixel output in columns of the image sensor by the N-bit A/D conversion means, and an A/D conversion in a second stage is performed on the amplified analog residual by the M-bit A/D conversion means, so as to perform N+M bit A/D conversion, and
wherein said M-bit A/D conversion means for the analog residual performs the M-bit A/D conversion after horizontally scanning the analog values.

13. An image sensor, comprising:
an element circuit comprising N-bit A/D conversion means arranged in an array, and an amplifier for amplifying an analog residual which is a difference between a pixel output and an N-bit A/D conversion result; and
M-bit A/D conversion means for performing A/D conversion on said analog residual,
wherein an A/D conversion in a first stage is performed on the pixel output in columns of the image sensor by the N-bit A/D conversion means, and an A/D conversion in a second stage is performed on the amplified analog residual by the M-bit A/D conversion means, so as to perform N+M bit A/D conversion, and
wherein said M-bit A/D conversion means for the analog residual operates M bits of A/D conversion elements arranged in an array in columns.

14. An image sensor, comprising:
an element circuit comprising N-bit A/D conversion means arranged in an array, and an amplifier for amplifying an analog residual which is a difference between a pixel output and an N-bit A/D conversion result; and
M-bit A/D conversion means for performing A/D conversion on said analog residual,
wherein an A/D conversion in a first stage is performed on the pixel output in columns of the image sensor by the N-bit A/D conversion means, and an A/D conversion in a second stage is performed on the amplified analog residual by the M-bit A/D conversion means, so as to perform N+M bit A/D conversion, and
wherein said N-bit A/D conversion means comprises one comparator, a lamp signal generator common for columns, and a register for fetching a graycode value, which is supplied from outside a column, at the point when the output of the comparator changes.

15. An image sensor, comprising:
an element circuit comprising N-bit A/D conversion means arranged in an array, and an amplifier for amplifying an analog residual which is a difference between a pixel output and an N-bit A/D conversion result; and
M-bit A/D conversion means for performing A/D conversion on said analog residual,
wherein an A/D conversion in a first stage is performed on the pixel output in columns of the image sensor by the N-bit A/D conversion means, and an A/D conversion in a second stage is performed on the amplified analog residual by the M-bit A/D conversion means, so as to perform N+M bit A/D conversion, and
wherein said N-bit A/D conversion means for the pixel output performs A/D conversion using a 1-bit comparator, said amplifier performs G times amplification in columns using the capacitance ratio of the capacitor, and by connecting one end of the capacitor to an input of said amplifier, and the other end of the capacitor to a reference voltage at reset, and changing said reference voltage to determine the operation point of the output voltage of the amplifier by the output of said 1-bit comparator, the output of said amplifier is controlled within a linear area without being saturated, even if G times amplification is performed.

16. An image sensor, comprising:
an element circuit comprising N-bit A/D conversion means arranged in an array, and an amplifier for amplifying an analog residual which is a difference between a pixel output and an N-bit A/D conversion result; and
M-bit A/D conversion means for performing A/D conversion on said analog residual,
wherein an A/D conversion in a first stage is performed on the pixel output in columns of the image sensor by the N-bit A/D conversion means, and an A/D conversion in a second stage is performed on the amplified analog residual by the M-bit A/D conversion means, so as to perform N+M bit A/D conversion, and
wherein said amplifier has a function to acquire the difference between the pixel output of the reset level and the pixel output of the signal level, and performs noise cancellation by the function.

* * * * *